(12) United States Patent
Su et al.

(10) Patent No.: US 11,750,116 B2
(45) Date of Patent: Sep. 5, 2023

(54) SELF-POWERED AUTOMOBILE EXHAUST GAS SENSOR AND PREPARATION METHOD THEREOF

(71) Applicant: University of Electronic Science and Technology of China, Chengdu (CN)

(72) Inventors: Yuanjie Su, Chengdu (CN); Qichen Gong, Chengdu (CN); Guangzhong Xie, Chengdu (CN); Mingliang Yao, Chengdu (CN); Chunxu Chen, Chengdu (CN); Jinyang Yi, Chengdu (CN); Li Jia, Chengdu (CN); Weizhi Li, Chengdu (CN); Huiling Tai, Chengdu (CN); Xiaosong Du, Chengdu (CN); Yadong Jiang, Chengdu (CN)

(73) Assignee: UNIVERSITY OF ELECTRONIC SCIENCE AND TECHNOLOGY OF CHINA, Chengdu (CN)

( * ) Notice: Subject to any disclaimer, the term of this patent is extended or adjusted under 35 U.S.C. 154(b) by 208 days.

(21) Appl. No.: 17/153,833

(22) Filed: Jan. 20, 2021

(65) Prior Publication Data
US 2021/0320596 A1    Oct. 14, 2021

(30) Foreign Application Priority Data
Jan. 21, 2020    (CN) .......................... 202010072203.7

(51) Int. Cl.
*H02N 1/04* (2006.01)
*F01N 11/00* (2006.01)
*H10N 30/05* (2023.01)

(52) U.S. Cl.
CPC .............. *H02N 1/04* (2013.01); *F01N 11/00* (2013.01); *H10N 30/05* (2023.02); *F01N 2560/026* (2013.01)

(58) Field of Classification Search
CPC ..... H02N 1/04; F01N 11/00; F01N 2560/026; H01L 41/27
See application file for complete search history.

(56) References Cited

U.S. PATENT DOCUMENTS

| 8,237,324 B2 * | 8/2012 | Pei ........................... F03G 7/06 |
| | | 310/306 |
| 8,803,406 B2 * | 8/2014 | Lee ....................... H10N 30/092 |
| | | 310/800 |

(Continued)

FOREIGN PATENT DOCUMENTS

| CN | 106018498 A | * | 10/2016 | ............. G01N 27/12 |
| CN | 207742140 U | * | 8/2018 | |

(Continued)

*Primary Examiner* — Jeffrey T Carley
(74) *Attorney, Agent, or Firm* — MATTHIAS SCHOLL P.C.; Matthias Scholl (57) ABSTRACT

A self-powered automobile exhaust gas sensor including a supporting frame, a ferroelectric-triboelectric coupling functional film, and two metal electrodes. The ferroelectric-triboelectric coupling functional film comprises a first end fixed on the supporting beam in middle of the supporting frame, and a second end is freestanding. The two metal electrodes are grounded and adhered on the upper and lower sides of the supporting frame, respectively. An iron block is mounted on the top of the supporting frame. The ferroelectric-triboelectric coupling functional film includes a negative triboelectric charging layer, a ferroelectric composite material layer and a positive triboelectric charging layer; the ferroelectric composite material layer is prepared via casting method by mixing the ferroelectric material and the gas-sensitive material; the negative triboelectric charging layer has stronger electron affinity ability than the positive triboelectric charging layer, and attracts electrons from the positive triboelectric charging layer.

10 Claims, 4 Drawing Sheets

(56) References Cited

U.S. PATENT DOCUMENTS

| | | | | |
|---|---|---|---|---|
| 8,901,943 B1* | 12/2014 | Kita | ............... | G01N 27/221 |
| | | | | 324/663 |
| 9,635,467 B2* | 4/2017 | Miyoshi | ............... | G10K 11/004 |
| 9,906,170 B2* | 2/2018 | Choi | ............... | H02N 1/04 |
| 10,003,281 B2* | 6/2018 | Kim | ............... | H02N 1/04 |
| 10,103,648 B2* | 10/2018 | Park | ............... | G04G 19/00 |
| 10,199,958 B2* | 2/2019 | Shin | ............... | H02N 1/04 |
| 10,302,455 B2* | 5/2019 | Yazdi | ............... | H01H 35/00 |
| 10,425,018 B2* | 9/2019 | Wang | ............... | H02N 1/04 |
| 10,439,517 B2* | 10/2019 | Wang | ............... | H02N 1/04 |
| 10,587,207 B2* | 3/2020 | Jung | ............... | H02N 1/04 |
| 10,622,919 B2* | 4/2020 | Park | ............... | H02N 1/04 |
| 10,938,323 B2* | 3/2021 | Kim | ............... | H02N 1/04 |
| 11,050,363 B2* | 6/2021 | Hu | ............... | C09D 183/04 |
| 11,133,755 B2* | 9/2021 | Song | ............... | H02N 1/04 |
| 11,196,357 B1* | 12/2021 | Matthews | ............... | H02J 7/0068 |
| 2011/0175012 A1* | 7/2011 | Harigai | ............... | B41J 2/14233 |
| | | | | 252/62.9 PZ |
| 2013/0049531 A1* | 2/2013 | Wang | ............... | H02N 1/04 |
| | | | | 310/309 |
| 2013/0256581 A1* | 10/2013 | Miyoshi | ............... | H10N 30/1051 |
| | | | | 427/535 |
| 2014/0246950 A1* | 9/2014 | Wang | ............... | H02N 1/04 |
| | | | | 310/310 |
| 2016/0346556 A1* | 12/2016 | Slepian | ............... | H02N 2/181 |
| 2017/0359001 A1* | 12/2017 | Wang | ............... | C23C 16/045 |
| 2020/0168788 A1* | 5/2020 | Wang | ............... | H01L 41/113 |

FOREIGN PATENT DOCUMENTS

| | | | |
|---|---|---|---|
| KR | 20150002452 A | * | 1/2015 |
| KR | 101870278 B1 | * | 6/2018 |

* cited by examiner

SELF-POWERED AUTOMOBILE EXHAUST GAS SENSOR AND PREPARATION METHOD THEREOF

CROSS-REFERENCE TO RELAYED APPLICATIONS

Pursuant to 35 U.S.C. § 119 and the Paris Convention Treaty, this application claims foreign priority to Chinese Patent Application No. 202010072203.7 filed Jan. 21, 2020, the contents of which, including any intervening amendments thereto, are incorporated herein by reference. Inquiries from the public to applicants or assignees concerning this document or the related applications should be directed to: Matthias Scholl P.C., Attn.: Dr. Matthias Scholl Esq., 245 First Street, 18th Floor, Cambridge, Mass. 02142.

BACKGROUND

The disclosure relates to the fields of energy harvesting technology, micro-electromechanical system (MEMS), and electronic polymer functional materials, specifically relates to a self-powered automobile exhaust gas sensor and preparation method thereof.

With the development of the Internet of Things, sensor networks have been widely used in military, marine monitoring, environmental monitoring, industrial production, and public life. At present, most of the sensors in the sensor network are powered by batteries, where maintenance personnel are highly required to regularly replace the batteries and maintain them in order to ensure the continuous operation of the network. For sensor nodes deployed in hazardous areas and extreme environments, the situation not only increases operating costs but also threatens the safety of maintenance personnel. On the other hand, the gas-sensing properties of materials used in semiconductor gas sensors demand for high operating temperature, which makes the traditional gas sensor heating units consuming large amount power. At the same time, in order to achieve effective detection and identification of mixed gases, gas sensors are often prepared into arrays to improve the selectivity of the sensors, which further increase the power consumption of the entire node. As a consequence, relying solely on battery power cannot meet the needs of such sensor nodes for long-term usage. Hence, for sensors installed in high-risk places or remote areas, it is difficult to achieve long-term stable and reliable external direct power supply. Converting the energy in the environment into electrical energy through self-powered technology is an ideal solution to solve the aforementioned power supply problem of wireless sensor nodes.

The energy supply mechanisms of self-powered gas sensors are mainly based on piezoelectric effect, electromagnetic effect, electrostatic effect, and photovoltaic effect. Among them, the self-powered technology based on piezoelectric effect mainly uses the electrical output of the piezoelectric material as a power source and a detection signal. The gas adsorbed on the surface of the piezoelectric material can change the concentration of free carriers inside the material, thereby adjusting the output characteristics of the piezoelectric material through external stress. Although the nanogenerator based on piezoelectric effect and self-powered detection technology have been developed to a certain extent, its low output attribute, low energy conversion efficiency and narrow material selection range significantly restricts the development of this technique.

SUMMARY

The disclosure provides a self-powered automobile exhaust gas sensor comprising a supporting frame, a ferroelectric-triboelectric coupling functional film and two metal electrodes. One end of the ferroelectric-triboelectric coupling functional film is fixed on the supporting beam in middle of the supporting frame, leaving the other end freestanding; two metal electrodes are grounded and adhered on the upper and lower sides of the supporting frame, respectively; an iron block is mounted on a top of the supporting frame.

The ferroelectric-triboelectric coupling functional film comprises a negative triboelectric charging layer, a ferroelectric composite material layer and a positive triboelectric charging layer; the ferroelectric composite material layer is prepared via casting method by mixing the ferroelectric material and the gas-sensitive material; the negative triboelectric charging layer has stronger electron affinity ability than the positive triboelectric charging layer, and attracts electrons from positive triboelectric charging layer; the negative triboelectric charging layer and the positive triboelectric charging layer are a porous structure in order for gas molecule diffusion and adsorption.

When in use, the automobile exhaust gas enters through the gap between the ferroelectric-triboelectric coupling functional film and the metal electrodes, the airflow vibrates the ferroelectric-triboelectric coupling functional film and renders repeated contact and separation with metal electrodes so as to realize charge transfer and thus electric power generation; meanwhile, the chemisorption of automobile exhaust gas on the gas-sensitive materials changes the output of friction power generation and enable the detection of automobile exhaust.

In a class of this embodiment, negative triboelectric charging layer is selected from polyimide, polyvinyl chloride, polytetrafluoroethylene, polydimethylsiloxane, polypropylene, polyethylene, polystyrene, polyvinylidene chloride, polychloroether, polymethyl methacrylate, polyvinyl alcohol, polyester, polyisobutylene, polyurethane elastic sponge, polyvinyl butyral, polyacrylonitrile, biphenol polycarbonate, or a combination thereof.

In a class of this embodiment, the positive triboelectric charging layer is selected from polyimide, polyvinyl chloride, polytetrafluoroethylene, polydimethylsiloxane, polypropylene, polyethylene, polystyrene, polyvinylidene chloride, polychloroether, polymethyl methacrylate, polyvinyl alcohol, nylon, polyester, polyisobutylene, polyurethane elastic sponge, polyvinyl butyral, polypropylene, biphenol polycarbonate, or a combination thereof.

In a class of this embodiment, the ferroelectric composite material layer is prepared via casting method by mixing the ferroelectric material and the gas-sensitive material, and the mass ratio of the ferroelectric material and the gas-sensitive material ranges from $1/20$ to $1/5$. The ferroelectric material is barium titanate, potassium dihydrogen phosphate, barium strontium titanate or potassium sodium niobate, and the gas-sensitive material is a material sensitive to nitrogen dioxide, a material sensitive to carbon monoxide or a material sensitive to sulphur dioxide. The materials sensitive to nitrogen dioxide includes polyaniline, zinc oxide, molybdenum disulfide, graphene, black phosphorus, tin disulfide, copper phthalocyanine, polythiophene, polypyrrole, lanthanum ferrite or dioxide tellurium; the materials sensitive to carbon monoxide are tin dioxide, tin oxide, titanium dioxide, copper oxide, tungsten disulfide, or carbon nanotubes; the materials sensitive to sulfur dioxide are polyvinyl alcohol, vanadium pentoxide, tungsten trioxide, neodymium oxide, dysprosium oxide, indium oxide or zirconium oxide.

In a class of this embodiment, the ferroelectric composite material layer has a thickness of 100 nm to 200 nm.

In a class of this embodiment, the electron affinity ability of the metal electrode is weaker than the negative triboelectric charging layer, but stronger than the positive triboelectric charging layer.

In a class of this embodiment, the metal electrode is copper, aluminum, gold or indium tin oxide conductive glass (ITO). The thickness of the metal electrode ranges from 30 to 70 micrometer.

In a class of this embodiment, the negative triboelectric charging layer and the positive triboelectric charging layer are flexible films with a porous structure. The porous structure is prepared by reactive ion etching (RIE) process, so that gas molecules could diffuse and chemisorb to the surface of the ferroelectric composite material layer for gas-sensing reaction. The size of pores ranges from 5 to 20 micrometer.

The disclosure also provides a method for preparing the self-powered automobile exhaust gas sensor, the method comprising:

1) cleaning and drying the flexible substrate;
2) using physical vapor deposition to deposit a metal electrode on a flexible substrate, and connect to ground through a lead;
3) preparing the ferroelectric composite material layer by the casting method;
4) adhering the negative triboelectric charging layer and the positive triboelectric charging layer onto the top and bottom sides of the ferroelectric composite material layer by hot padding; The electron affinity ability of the metal electrode is weaker than the negative triboelectric charging layer, but stronger than the positive triboelectric charging layer, leaving the surface of the negative triboelectric charging layer negatively charged and the surface of the positive triboelectric charging layer positively charged in the process of contact and separation;
5) using a photolithographic etching process to etch a porous structure on the surfaces of the negative triboelectric charging layer and the positive triboelectric charging layer, so that gas molecules diffuse and chemisorb to the surface of the ferroelectric composite material layer for gas-sensing reaction;
6) fixing the flexible substrate with metal electrodes inside the supporting frame and constructing a sandwich sensing structure comprising the negative triboelectric charging layer, the ferroelectric composite material layer, and the positive triboelectric charging layer inside the supporting frame. The iron block is mounted on the top of the supporting frame to increase the mechanical stability of the sensor under the blowing of the airflow.

The disclosure proposes a self-powered automobile exhaust gas sensor. When the automobile exhaust gas enters through the gap between the ferroelectric-triboelectric coupling functional film and the metal electrode, the airflow vibrates the ferroelectric-triboelectric coupling functional film and renders repeated contact and separation with metal electrodes. According to the ranking of triboelectric series, the electron affinity ability of the copper electrode is weaker than the negative triboelectric charging layer, but stronger than the positive triboelectric charging layer. As a result, the airflow induced contact and separation leads to equal and opposite triboelectric charges on the upper and bottom surface of the triboelectric coupling functional film, i.e. the negative charge on the negative triboelectric charging layer and positive charge on the positive triboelectric charging layer, as sketched in pictures b-c of FIG. 3. These triboelectric charges maintain for months due to the polymer nature yield electric field downwards and render the polarization of the ferroelectric-triboelectric coupling functional film. At the same time, the remnant polarization of the ferroelectric-triboelectric coupling functional film (picture d of FIG. 3) is conducive to the contact electrification and thus the enhancement of triboelectric charge density on the contacting surfaces (pictures e-g in FIG. 3). These two processes conjugate with each other and jointly improve the performance of the electricity generation (picture X of FIG. 3).

Figure 4A:
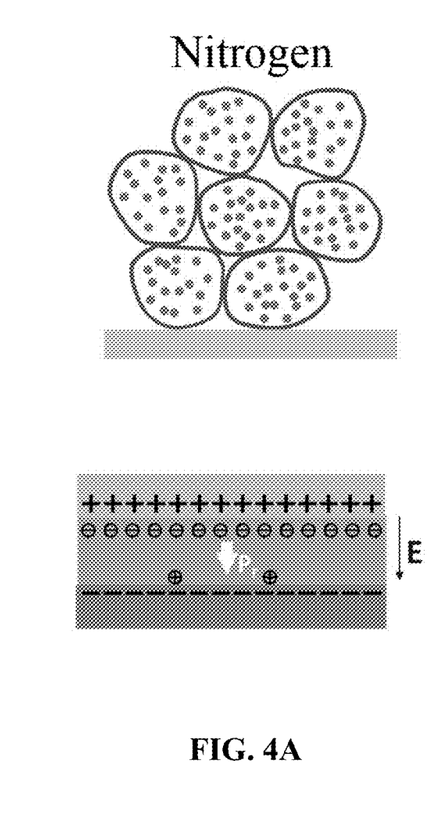
FIGS. 4A-4C show gas sensing mechanism of a self-powered automobile exhaust gas sensor provided by the disclosure.
Figure 4B:
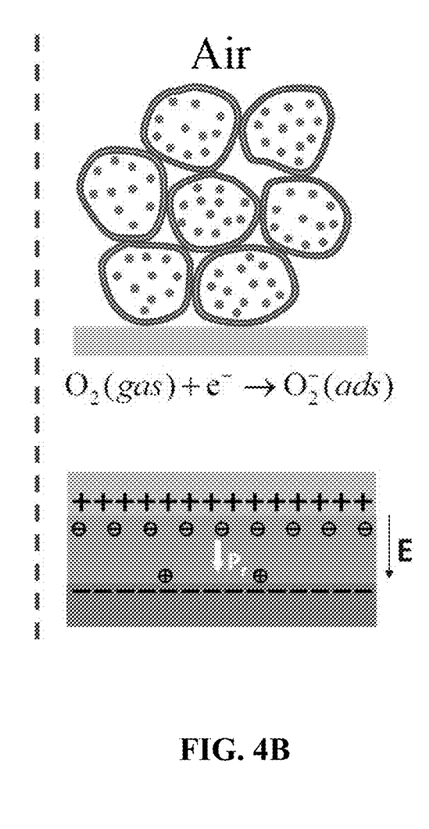
Figure 4C:
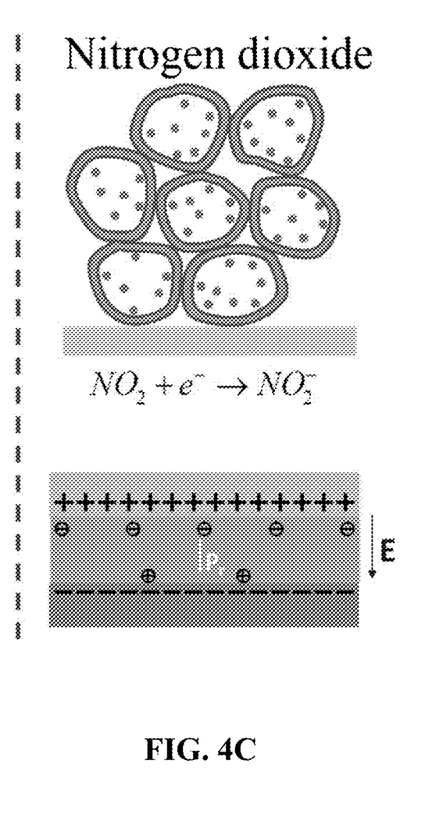

Meanwhile, the chemisorption of automobile exhaust gas ($NO_{2(gas)} + e^- \rightarrow NO_{2(ads)}^-$) on the gas-sensitive materials can decrease the electron concentration inside the ferroelectric composite material layer, as sketched in FIGS. 4A-4C, which reduce the residual polarization intensity inside the material. As mentioned above, with decreasing residual polarization the output signal of the device declines. Consequently, the external atmosphere can be deduced according to the output electric signals to realize the self-driven detection of the type and concentration without a power source.

Compared with the existing technology, the beneficial effects of the disclosure are:

The self-powered automobile exhaust gas sensor proposed by the disclosure can spontaneously improve the surface charge density and energy conversion efficiency of the energy collection device through the coupling effect of the ferroelectric effect and the triboelectric effect. The disclosure utilizes the electric field formed by the triboelectric charges with opposite signs on the upper and bottom sides to polarize the ferroelectric triboelectric coupling function film, and the residual polarization in the ferroelectric triboelectric coupling function film will in turn enhance the electrification ability of the triboelectric film, which induces more triboelectric charge on its surface; these two processes couple with each other and jointly improves the energy conversion efficiency and sensitivity of the self-powered sensor. The self-powered automobile exhaust gas sensor proposed by the disclosure owns simple preparation process, novel structure, low cost, high practicability, and fully utilizes the energy of nature.

In the drawings, the following number references are used: 1. Metal electrode; 2. Ferroelectric-triboelectric coupling functional film; 3. Supporting frame; 4. Supporting beam; 5. Iron block; 6. Negative triboelectric charging layer;

7. Ferroelectric composite material layer; 8. Positive triboelectric charging layer; 21. Fixed end; and 22. Movable end.

DETAILED DESCRIPTION OF THE EMBODIMENTS

To further illustrate the disclosure, embodiments detailing a self-powered automobile exhaust gas sensor and preparation method thereof are described below. It should be noted that the following embodiments are intended to describe and not to limit the disclosure.

Example 1

In this example, the self-powered automobile exhaust gas sensor is sensitive to nitrogen dioxide ($NO_2$) in automobile exhaust gas, and its structure: the negative triboelectric charging layer 6 is polytetrafluoroethylene (PTFE); the positive triboelectric charging layer 8 is nylon (Nylon); the ferroelectric composite material layer 7 is a composite material of barium titanate and polypyrrole; the metal electrode 1 is a copper film with a thickness of 50 micrometer.

The preparation method of the self-powered automobile exhaust gas sensor in Example 1 comprises the following steps:

1) Cutting a flexible polyethylene terephthalate (PET) film substrate with a thickness of 250 µm and a size of 3 cm×3 cm, followed by ultrasonic cleaning with acetone and ethanol for 15 min and drying.

2) Depositing a copper film on the PET flexible substrate processed in 1) by magnetron sputtering as a metal electrode layer, and then connecting the metal electrode to ground through a lead; where the sputtering gas pressure is 6 m Torr and the sputtering power is 100 W, sputtering time is 1 hour.

3) Preparing the ferroelectric composite material layer by the casting method, which is detailed as follows:

3.1) Weighing 60 mg of barium titanate (BTO) nanoparticles and 1.2 g of polypyrrole powder, and measuring 15 mL of N,N-Dimethylformamide (DMF) solvent.

3.2) Dispersing 60 mg of BTO nanoparticles in 15 mL of DMF solvent and ultrasonic treatment for 30 minutes to make the nanoparticles evenly dispersed in DMF solvent; then adding 1.2 g of polypyrrole powder and magnetically stir for 3 hours under 50° C. water bath to obtain a stable and even BTO/polypyrrole mixed solution.

3.3) Casting the above BTO/polypyrrole mixed solution on the electronic glass substrate that has been placed on a horizontal heating table, turning on the power of the heating table and set the heating temperature to 90° C., and heating for 1 hour under this condition, the purpose is to evaporate the DMF solvent to obtain composite film, and then peeling off the composite film with a metal blade to obtain a ferroelectric composite material layer.

4) Using hot padding to attach respectively the polytetrafluoroethylene (PTFE) and nylon (Nylon) on the front and back sides of the ferroelectric composite material layer obtained in 3) as negative triboelectric charging layer 6 and positive triboelectric charging layer 8; the temperature of hot stamping is 220° C., the pressure is 30 MPa, and the time is 30 min.

5) Using a photolithographic etching process to etch a porous structure on the surfaces of the negative triboelectric charging layer 6 and the positive triboelectric charging layer 8, so that gas molecules diffuse and chemisorb to the surface of the ferroelectric composite material layer for gas-sensing reaction; specifically: a mixed gas contains Ar with a flow rate of 15.0 SCCM, $O_2$ with a flow rate of 10.0 SCCM and CF4 with a flow rate of 30.0 SCCM, and the mixed gas is passed into the reactive ion etching chamber, and the etching time is 15 s. During the etching process, a power source with a power of 400 W is used to generate plasma, while another power source with a power of 100 W is used to accelerate the plasma ions, thus, holes are formed in the negative triboelectric charging layer 6 and the positive triboelectric charging layer 8.

6) Attaching the PET with copper film obtained in 2) inside the supporting frame 3 as an electrode, and constructing a sandwich sensing structure comprising the negative triboelectric charging layer 6, the ferroelectric composite material layer 7, and the positive triboelectric charging layer 8 inside the supporting frame 3. The iron block 5 was mounted on the top of the supporting frame 3 to increase the mechanical stability of the sensor under the blowing of the airflow. Through the above steps, the self-powered automobile exhaust gas sensor can be fabricated.

Figure 1:
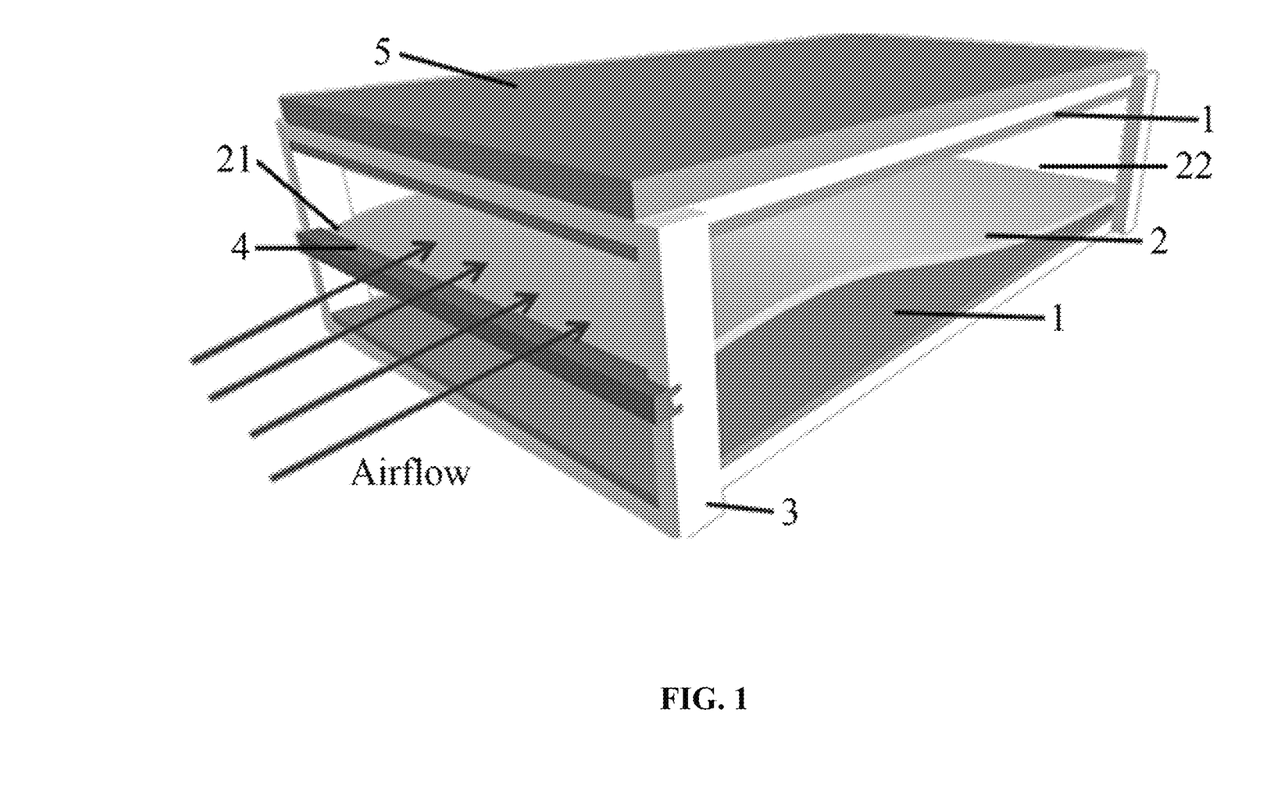
FIG. 1 is a schematic structural diagram of a self-powered automobile exhaust gas sensor provided by the disclosure.
Figure 2:
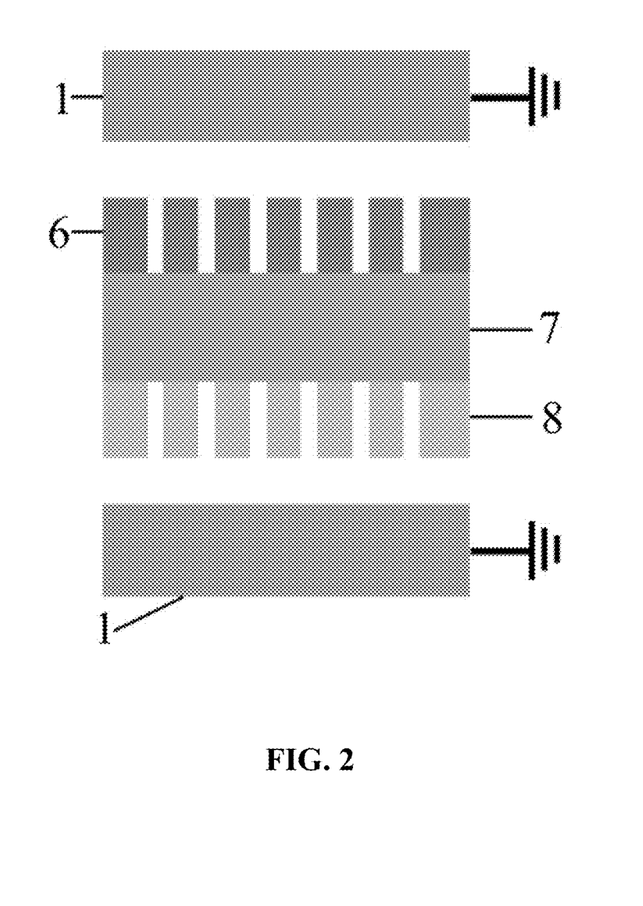
FIG. 2 is a schematic structural diagram of a ferroelectric-triboelectric coupling functional film in a self-powered automobile exhaust gas sensor provided by the disclosure.
Figure 3:
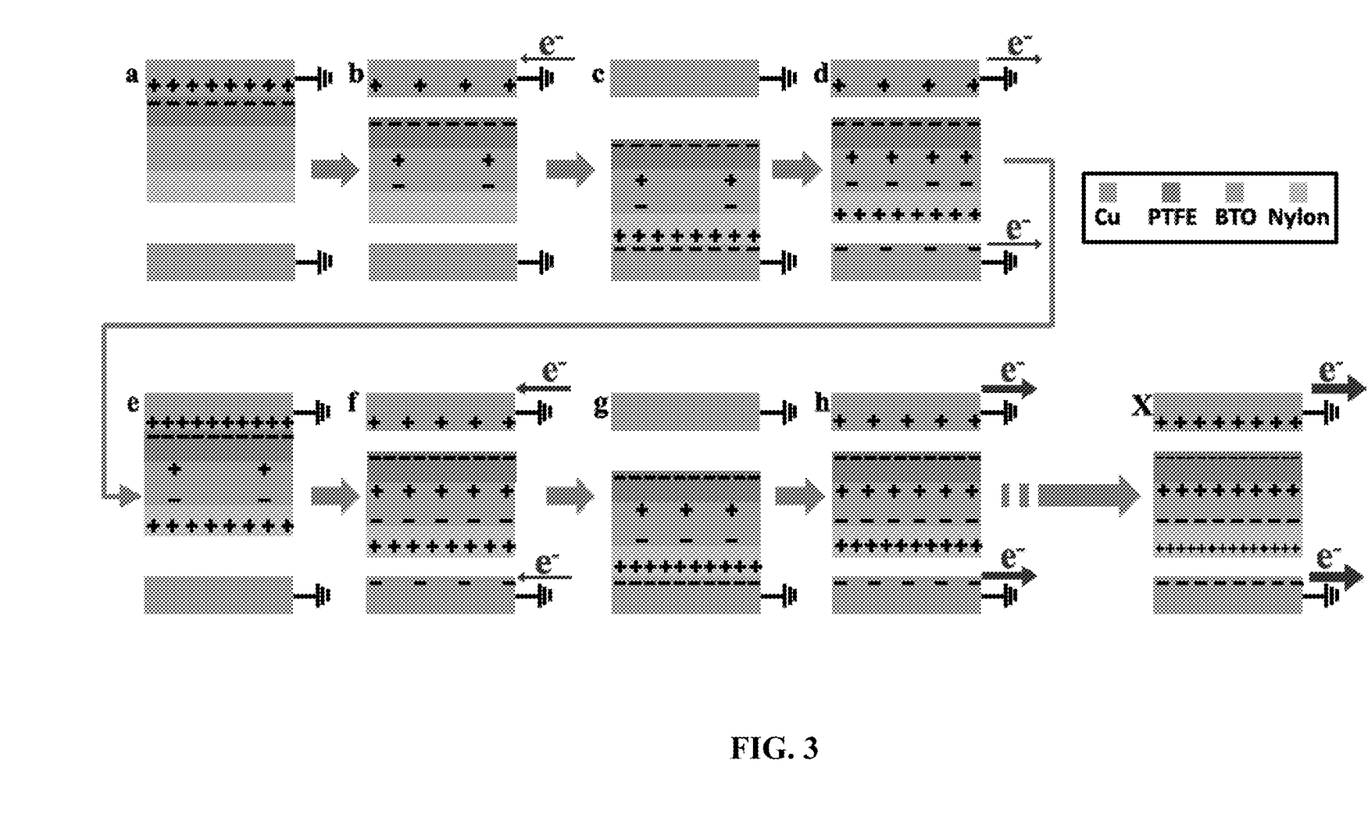
FIG. 3 is a mechanism of ferroelectric triboelectric coupling to enhance power generation in a self-powered automobile exhaust gas sensor provided by the disclosure.

The energy generation principle of the self-powered automobile exhaust gas sensor in the disclosure is shown in picture a of FIG. 3. When the automobile exhaust gas enters through the gap between the ferroelectric-triboelectric coupling functional film 2 and the metal electrode 1, the airflow vibrates the ferroelectric-triboelectric coupling functional film 2 and renders repeated contact and separation with the two metal electrodes 1. According to the ranking of triboelectric series, the electron affinity ability of the copper electrode is weaker than the negative triboelectric charging layer 6, but stronger than the positive triboelectric charging layer 8 (gain electron ability: PTFE>Cu>Nylon). As a result, the airflow induced contact and separation leads to equal and opposite triboelectric charges on the upper and bottom surface of the triboelectric coupling functional film 2, i.e. the negative charge on the negative triboelectric charging layer 6 and positive charge on the positive triboelectric charging layer 8, as sketched in pictures b-c of FIG. 3. These triboelectric charges maintaining for months due to the polymer nature yield electric field downwards and render the polarization of the ferroelectric-triboelectric coupling functional film 2. At the same time, the remanent polarization of the ferroelectric-triboelectric coupling functional film 2 (picture d of FIG. 3) is conducive to the contact electrification and thus the enhancement of triboelectric charge density on the contacting surfaces (pictures e-g in FIG. 3). These two processes conjugate with each other and jointly improve the performance of the electricity generation (picture X of FIG. 3).

The gas detection mechanism of the self-powered automobile exhaust gas sensor in the disclosure is shown in FIGS. 4A-4C. For example, detecting the nitrogen dioxide ($NO_2$) in the automobile exhaust gas. The chemisorption of detected gas ($NO_{2(gas)} + e^- \rightarrow N_{2(ads)}^-$) on the gas-sensitive materials can change the electron concentration inside the ferroelectric composite material layer 7, which change the residual polarization intensity inside the material. Further, with changing residual polarization the output signal of the device changes. Consequently, the external atmosphere can be deduced according to the output electric signals to realize the self-driven detection of the type and concentration without a power source. As shown in FIG. 4A, when the sensor is in nitrogen, there is no chemisorption of gas molecules on the surface of the ferroelectric composite material layer 7. When the sensor is in dry air, the chemisorption of oxygen molecules on the gas-sensitive materials will generate oxygen ions (FIG. 4B). The process can absorb free electron and reduce the residual polarization intensity inside the material. When the sensor is in $NO_2$, the $NO_2$ also absorbs free electron and reduce the residual polarization intensity inside the material (FIG. 4C). As mentioned above, with the change of the concentration of $NO_2$, the output signal of the device changes. Consequently, the concentration of detected gas can be deduced according to the output electric signals.

Example 2

Compared with Example 1, by using tin dioxide as the gas-sensitive material, the fabricated sensor can detect carbon monoxide in the automobile exhaust gas.

Example 3

Compared with Example 1, by using polyvinyl alcohol as the gas-sensitive material, the fabricated sensor can detect sulfur dioxide in the automobile exhaust gas.

It will be obvious to those skilled in the art that changes and modifications may be made, and therefore, the aim in the appended claims is to cover all such changes and modifications.

What is claimed is:

1. A device, comprising:
  a supporting beam;
  a supporting frame;
  a ferroelectric-triboelectric coupling functional film; and
  two metal electrodes;
  wherein:
    the ferroelectric-triboelectric coupling functional film comprises a first end fixed on the supporting beam in middle of the supporting frame, and a second end freestanding; the two metal electrodes are grounded and adhered on upper and lower sides of the supporting frame, respectively; an iron block is mounted on a top of the supporting frame;
    the ferroelectric-triboelectric coupling functional film comprises a negative triboelectric charging layer, a ferroelectric composite material layer and a positive triboelectric charging layer; the ferroelectric composite material layer is prepared via casting method by mixing a ferroelectric material and a gas-sensitive material; the negative triboelectric charging layer has stronger electron affinity ability than the positive triboelectric charging layer, and attracts electrons from the positive triboelectric charging layer; the negative triboelectric charging layer and the positive triboelectric charging layer are a porous structure in order for gas molecule diffusion and adsorption; and
    when in use, automobile exhaust gas enters through a gap between the ferroelectric-triboelectric coupling functional film and the two metal electrodes, the airflow vibrates the ferroelectric-triboelectric coupling functional film and renders repeated contact and separation with the two metal electrodes so as to realize charge transfer and thus electric power generation; meanwhile, the chemisorption of automobile exhaust gas on the gas-sensitive materials changes the output of electric power generation and enable the detection of automobile exhaust.

2. The device of claim 1, wherein the negative triboelectric charging layer is polyimide, polyvinyl chloride, polytetrafluoroethylene, polydimethylsiloxane, polypropylene, polyethylene, polystyrene, polyvinylidene chloride, polychloroether, polymethyl methacrylate, polyvinyl alcohol, polyester, polyisobutylene, polyurethane elastic sponge, polyvinyl butyral, polyacrylonitrile, biphenol polycarbonate, or a combination thereof.

3. The device of claim 1, wherein the positive triboelectric charging layer is polyimide, polyvinyl chloride, polytetrafluoroethylene, polydimethylsiloxane, polypropylene, polyethylene, polystyrene, polyvinylidene chloride, polychloroether, polymethyl methacrylate, polyvinyl alcohol, nylon, polyester, polyisobutylene, polyurethane elastic sponge, polyvinyl butyral, polypropylene, biphenol polycarbonate, or a combination thereof.

4. The device of claim 1, wherein the ferroelectric composite material layer is prepared via casting method by mixing the ferroelectric material and the gas-sensitive material, and a mass ratio of the ferroelectric material and the gas-sensitive material ranges from 1/20 to 1/5.

5. The device of claim 4, wherein the ferroelectric material is barium titanate, potassium dihydrogen phosphate, barium strontium titanate or potassium sodium niobate, and the gas-sensitive material is a material sensitive to nitrogen dioxide, a material sensitive to carbon monoxide or a material sensitive to sulphur dioxide.

6. The device of claim 5, wherein the materials sensitive to nitrogen dioxide includes polyaniline, zinc oxide, molybdenum disulfide, graphene, black phosphorus, tin disulfide, copper phthalocyanine, polythiophene, polypyrrole, lanthanum ferrite or tellurium dioxide; the materials sensitive to carbon monoxide are tin dioxide, tin oxide, titanium dioxide, copper oxide, tungsten disulfide, or carbon nanotubes; the materials sensitive to sulfur dioxide are polyvinyl alcohol, vanadium pentoxide, tungsten trioxide, neodymium oxide, dysprosium oxide, indium oxide or zirconium oxide.

7. The device of claim 1, wherein the ferroelectric composite material layer has a thickness from 100 nm to 200 nm.

8. The device of claim 1, wherein an electron affinity ability of the metal electrode is weaker than the negative triboelectric charging layer and is stronger than the positive triboelectric charging layer.

9. The device of claim 1, wherein the negative triboelectric charging layer and the positive triboelectric charging layer are flexible films with a porous structure, in which a size of pores ranges from 5 to 20 micrometer.

10. A method for preparing the device of claim 1, the method comprising:
  1) cleaning and drying a flexible substrate;
  2) using physical vapor deposition to deposit a metal electrode on the flexible substrate, and connect to ground through a lead;
  3) preparing the ferroelectric composite material layer by the casting method;
  4) adhering the negative triboelectric charging layer and the positive triboelectric charging layer onto top and bottom sides of the ferroelectric composite material layer by hot padding; wherein the electron affinity ability of the metal electrode is weaker than the negative triboelectric charging layer and is stronger than the positive triboelectric charging layer, leaving the surface of the negative triboelectric charging layer negatively charged and the surface of the positive triboelectric charging layer positively charged in the process of contact and separation;
  5) using a photolithographic etching process to etch a porous structure on the surfaces of the negative triboelectric charging layer and the positive triboelectric charging layer, so that gas molecules diffuse and chemisorb to the surface of the ferroelectric composite material layer for gas-sensing reaction; and 6) fixing the flexible substrate with metal electrodes inside the supporting frame, and constructing a sandwich sensing structure comprising the negative triboelectric charging layer, the ferroelectric composite material layer, and the positive triboelectric charging layer inside the supporting frame; wherein the iron block is mounted on the top of the supporting frame to fabricate the self-powered automobile exhaust gas sensor.

\* \* \* \* \*